(12) United States Patent
Cho et al.

(10) Patent No.: US 6,170,235 B1
(45) Date of Patent: Jan. 9, 2001

(54) WAFER PACKAGING METHOD

(75) Inventors: Kyoo-chul Cho; Jea-gun Park; Sung-hoon Cho, all of Kyungki-do (KR)

(73) Assignee: Samsung Electronics Co., Ltd., Suwon (KR)

( * ) Notice: Under 35 U.S.C. 154(b), the term of this patent shall be extended for 0 days.

(21) Appl. No.: 09/206,234

(22) Filed: Dec. 7, 1998

(30) Foreign Application Priority Data

Dec. 29, 1997 (KR) .................................................. 97-76788

(51) Int. Cl.⁷ ...................................................... B65B 55/00
(52) U.S. Cl. ................................. 53/428; 53/469; 414/292
(58) Field of Search ............................... 53/432, 433, 434, 53/469, 512; 414/292; 206/832

(56) References Cited

U.S. PATENT DOCUMENTS

| | | | | |
|---|---|---|---|---|
| 5,098,245 | * | 3/1992 | Toro-Lira | 414/292 |
| 5,364,219 | * | 11/1994 | Takahashi | 414/292 |
| 5,398,481 | * | 3/1995 | Takeuchi | 53/432 |
| 5,644,855 | * | 7/1997 | McDermott | 414/292 |

* cited by examiner

*Primary Examiner*—Linda Johnson
(74) *Attorney, Agent, or Firm*—Jones Volentine, LLC

(57) ABSTRACT

A wafer packaging method in which a wafer is placed into a packaging bag that is sealed before the concentration of sulphuric oxide on the surface of the wafer reaches $3\times10^{12}$ atoms/cm². The placing of the wafer in the wafer packaging bag is carried out in a substantially clean environment

4 Claims, 12 Drawing Sheets

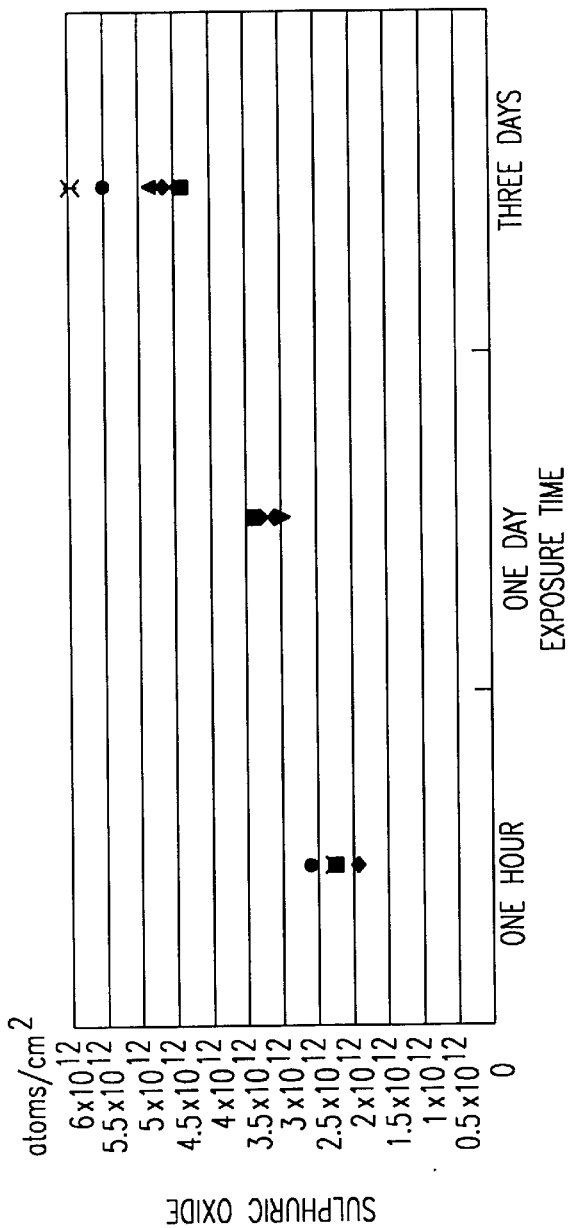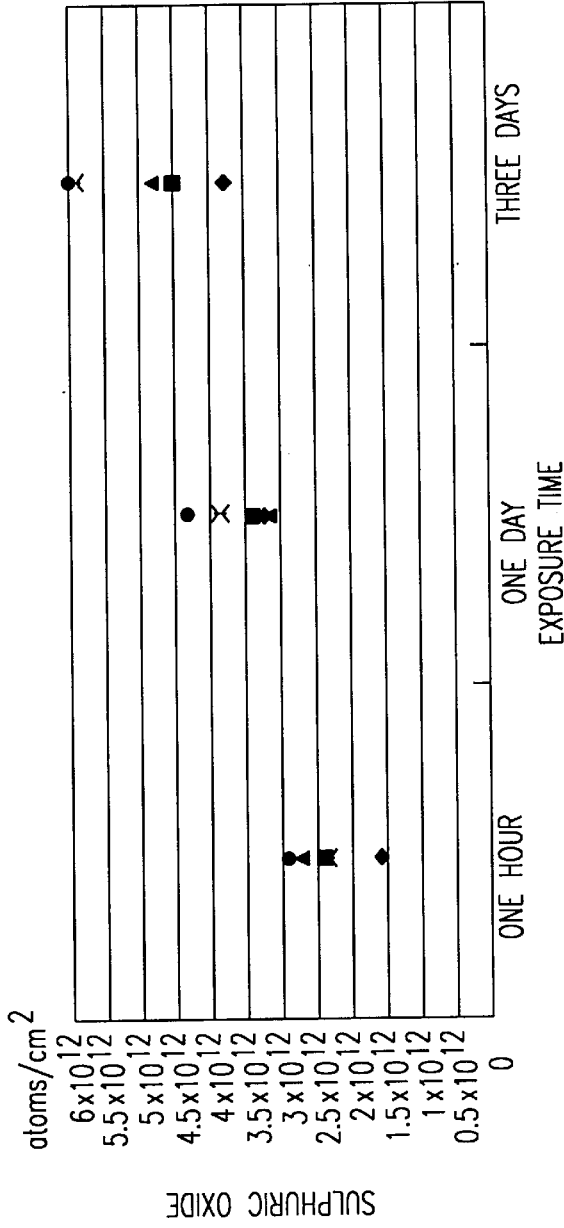

WAFER PACKAGING METHOD

BACKGROUND OF THE INVENTION

1. Field of The Invention

The present invention relates to a method of packaging wafers, and more particularly, to a method of packaging wafers to prevent the wafers from being contaminated by the external environment.

2. Description of the Related Art

The wafers used in manufacturing semiconductor devices are mainly comprised of silicon crystal. In order to achieve more precise device fabrication and greater device yields, contamination free wafers are essential, and appropriate packaging is required to prevent such contamination from the external environment. Bare wafers, as well as those having semiconductor devices formed thereon, must sometimes be stored for a predetermined period, and therefore should be packaged and stored properly to avoid contamination.

Packaging bags made of a laminated film have been employed to store the wafers. The laminated film generally consists of a polyethylene film, an adhesive film, and an aluminum-coated polyethylene film that are stacked successively. In order to prevent contaminating particles from the external environment from contacting the wafer or the packaging bag, several methods of packaging have been employed. These methods include: flushing the package with nitrogen and then sealing (nitrogen flushing package); reducing the vacuum pressure of the package for more than 4.5 seconds and then sealing (vacuum reduced pressure package); and placing a wafer in a reinforced packaging bag and then reducing the vacuum pressure of the package for about 3 seconds and then sealing (reinforced packaging bag package). The reinforced packaging bag includes an additional polyethylene film layer and an additional aluminum-coated polyethylene film layer that are added to the structure of the prior laminated bag.

While the nitrogen flushing package and vacuum reduced pressure package both are theoretically designed to eliminate contaminating particles in the packaging bag into which the wafer is put, it has been found that such packaging methods tend to increase the contaminating particles on the wafer, thereby decreasing the storage stability of the wafer.

With regard to the wafer contamination, if sulphuric oxide ($SO_x$) is adsorbed onto the surface of the wafer, it creates a haze that contaminates the surface, and acts as a nucleation source for further particulate contamination. As shown in the graph of FIG. 1, the amount of sulphuric oxide on the respective surfaces of several wafers increases from about $2.3 \times 10^{12}$ atoms/cm$^2$ after one hour of exposure to the external air, to about $3.3 \times 10^{12}$ atoms/cm$^2$ after one day of exposure, and to about $4.5$–$6.0 \times 10^{12}$ atoms/cm$^2$ after three days of exposure. Thus, the amount of time the wafer is exposed to the external air prior to packaging is an important factor affecting the initial sulphuric oxide contamination concentration. The sulphuric oxide contamination measurements for the example above, as well as those described below, are performed using a Total Reflective X-Ray Fluorescent Spectroscopy instrument (TRXRF), manufactured by Rikaku Co. of Japan. Also, note that the various symbols in the figures refer to different wafers, although some of the symbols in the graphs overlap.

FIGS. 2–7 are graphs depicting various concentration amounts of sulphuric oxide contamination on a wafer exposed to the external air containing sulphuric oxide for time periods of one hour, one day, and three days. The wafers are then packaged according to the conventional packaging methods as described above, and thereafter stored for predetermined time periods, namely 23 days and 45 days. FIGS. 2, 3 and 4 depict the amount of sulphuric oxide contamination on a wafer that was exposed to external air containing sulphuric oxide for time periods of one hour, one day, and three days, and then stored for 23 days in a conventional nitrogen flushing package (in FIG. 2), vacuum reduced pressure package (in FIG. 3), and reinforced packaging bag package (in FIG. 4). FIGS. 5, 6 and 7 depict the amount of sulphuric oxide contamination on a wafer that was exposed to external air containing sulphuric oxide for time periods of one hour, one day, and three days, and then stored for 45 days in a conventional nitrogen flushing package (in FIG. 5), vacuum reduced pressure package (in FIG. 6), and reinforced packaging bag package (in FIG. 7).

As shown in FIGS. 1–7, the relatively small fluctuations in sulphuric oxide on the wafer surface indicate that the packaging types and period of storage have little effect on the initial contamination concentration of sulphuric oxide. However, while the initial contamination concentration of sulphuric oxide acts only as the haze's nucleation source, the longer the period of storage the greater is the acceleration of the nucleation, and the greater is the probability of particulate contamination. Although one of the "three day exposure" data points for the contamination concentration in FIG. 7 appears low, this is considered to be an experimental and/or measurement error.

FIGS. 8–13 show the increase or decrease in the number of contaminating particles under the conditions identified in FIGS. 2–7, as classified by particle size. More specifically, FIGS. 8, 9 and 10 depict the particle size distribution on a wafer that was exposed to external air containing sulphuric oxide for time periods of one hour, one day, and three days, and then stored for 23 days in a conventional nitrogen flushing package (in FIG. 8), vacuum reduced pressure package (in FIG. 9), and reinforced packaging bag package (in FIG. 10). FIGS. 11, 12 and 13 depict the particle size distribution on a wafer that was exposed to external air containing sulphuric oxide for time periods of one hour, one day, and three days, and then stored for 45 days in a conventional nitrogen flushing package (in FIG. 11), vacuum reduced pressure package (in FIG. 12), and reinforced packaging bag package (in FIG. 13). A Surfscan-6200 measurement apparatus (manufactured by KLA & TENCOR Co.), was used to ascertain the particle measurements.

For the nitrogen flushing packages of FIGS. 8 and 11, there is shown a rapid increase in particles on a wafer exposed for three days and stored for 23 days (FIG. 8), and exposed for both one day and three days and stored for 45 days (FIG. 11).

The increase or decrease in the particles shows no definite tendency for the vacuum reduced packages of FIGS. 9 and 12. Such irregular results make it difficult to predict the storage stability of the wafer.

For the reinforced packaging bag packages shown in FIGS. 10 and 13, the particulate contamination increases significantly on a wafer exposed for three days and stored for 23 days and 45 days.

From the above results, several possibilities arise as causes for the deterioration of wafer storage stability. For example, in the case of the nitrogen flushing method, the nitrogen supply includes a filtering means installed on a nitrogen supply line for filtering foreign matter contained in the nitrogen, such as particulates. The particulates that accumulate in the filtering means are emitted at irregular and unpredictable intervals during the nitrogen flushing, which accumulate in the packaging bag. Therefore, frequent cleaning of the nitrogen supply line or frequent filter changes are required, which increases production costs while reducing productivity.

In case of the vacuum reduced pressure method, the air in the packaging bag is drawn out and expands rapidly during the method, which results in a large temperature decrease on the wafer surface, thereby causing the sulphuric oxide in the air to condense and adhere to the wafer surface and increasing the particulate contamination.

In the reinforced packaging bag method, the particulate contamination is lower than the vacuum reduced pressure package because the vacuum application time is shorter (less than 3 seconds) than in the normal vacuum reduced pressure package (more than 4.5 seconds).

Accordingly, a need exists for a wafer packaging method in which a wafer, or a semiconductor device formed on the wafer, can be stored for a long period of time in a stable manner.

SUMMARY OF THE INVENTION

An object of the present invention is to provide a wafer packaging method which simplifies packaging and has a high storage stability.

To achieve this and other objects, the present invention provides a wafer packaging method in which a wafer is placed in a packaging bag that is sealed before the concentration of sulphuric oxide on the surface of the wafer reaches $3 \times 10^{12}$ atoms/cm$^2$. The method does not use either of the conventional nitrogen flushing or longer vacuum reduced pressure packaging methods.

BRIEF DESCRIPTION OF THE ATTACHED DRAWINGS

These and other features of the invention will be understood more clearly from the following description, read in conjunction with the drawings, in which:

FIG. 1 is a graph depicting various amounts of sulphuric oxide contamination on a wafer exposed to the external air containing sulphuric oxide for time periods of one hour, one day, and three days;

FIG. 2 is a graph depicting the amount of sulphuric oxide contamination on a wafer that was exposed to external air containing sulphuric oxide for time periods of one hour, one day, and three days, and then stored for 23 days using a conventional nitrogen flushing package;

Figure 21:
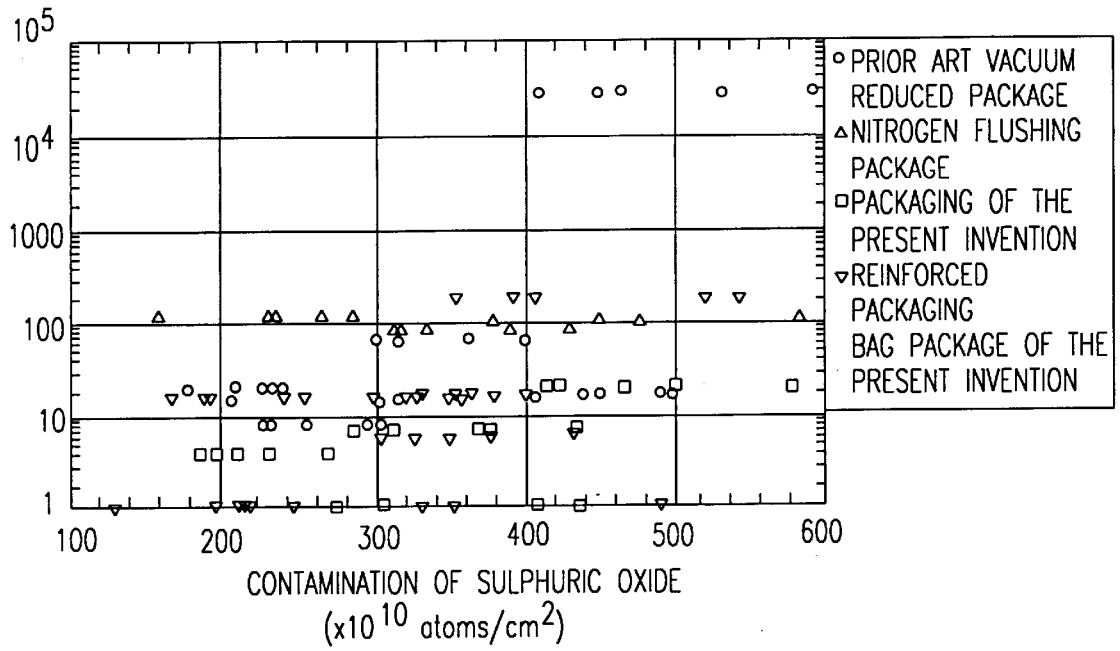
Figure 22:
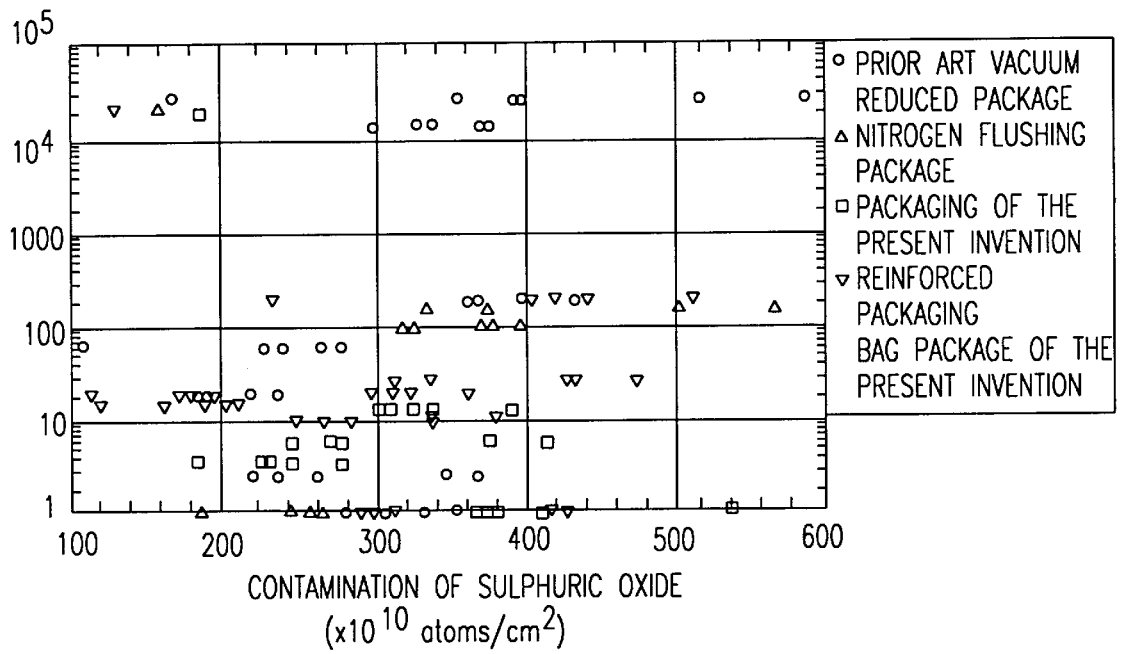

FIG. 21 is a graph depicting the number of particulates in the size range 0.12–0.16 µm compared to the sulphuric oxide concentration according to the various packaging methods, after being stored for 23 days in the packaging; and FIG. 22 is a graph depicting the number of particulates in the size range 0.12–0.16 μm compared to the sulphuric oxide concentration according to the various packaging methods, after being stored for 45 days in the packaging.

DETAILED DESCRIPTION OF PREFERRED EMBODIMENTS

Hereinafter, preferred embodiments of the present invention will be described with reference to the attached drawings.

In general, the inventors have determined that a wafer may be stored in a stable manner utilizing a wafer packaging method in which a wafer is placed into a packaging bag and sealed before the sulphuric oxide concentration on the wafer surface reaches $3\times10^{12}$ atoms/cm$^2$.

In the present invention, the contamination concentration of sulphuric oxide on the surface of wafer is measured and controlled to prevent a haze from forming. As discussed previously, the haze is caused by sulphuric oxide contamination when the wafer is exposed to external air containing the sulphuric oxide. By controlling the sulphuric oxide contamination, the increase in particulate contamination is prevented, thereby enhancing long-term wafer packaging and storage stability.

In the present invention, the conventional techniques of nitrogen flushing packaging and the longer vacuum reduced pressure packaging are not used prior to sealing the packaging bag. This eliminates the previously described nitrogen filtering problem in the nitrogen filtering packaging method, in which the nitrogen supply filter itself acts as a source of particulate contamination on the wafer surface. This also eliminates the previously described large temperature decrease associated with the longer vacuum reduced pressure packaging method, in which the sulphuric oxide in the air condenses and adheres to the wafer surface, furthering the particulate contamination.

The wafer packaging method of the present invention should be carried out in a Class 10 clean room, preferably while sulphuric oxide in the air is reduced. The packaging bag may be formed by lamination of a polyethylene film, an adhesive film, and an aluminum-coated polyethylene film, and preferably as a reinforced bag formed by lamination of a polyethylene film, an adhesive film, an aluminum-coated polyethylene film, another polyethylene film, and another aluminum-coated polyethylene film. Such packaging bags or reinforced packaging bags are well-known and commercially available.

The wafer is then placed in the packaging bag before the concentration of sulphuric oxide on the surface of wafer reaches $3\times10^{12}$ atoms/cm$^2$, and then the packaging bag is sealed and packaged without using the conventional nitrogen flushing and longer vacuum reduced pressure packaging techniques.

Control Group

Figure 3:
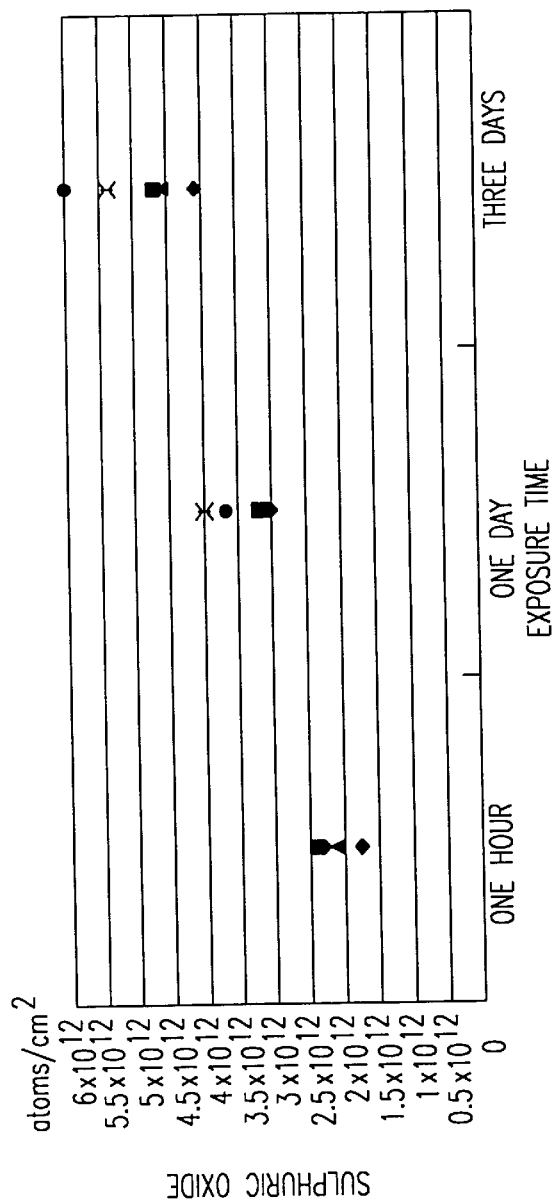
FIG. 3 is a graph depicting the amount of sulphuric oxide contamination on a wafer that was exposed to external air containing sulphuric oxide for time periods of one hour, one day, and three days, and then stored for 23 days using a conventional vacuum reduced pressure package.
Figure 4:
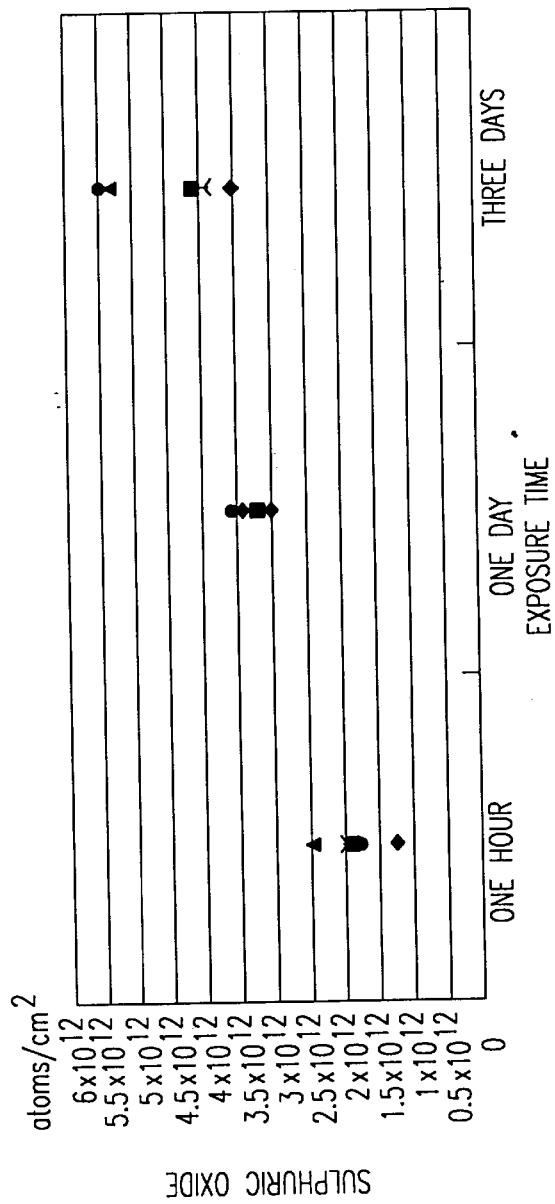
FIG. 4 is a graph depicting the amount of sulphuric oxide contamination on a wafer that was exposed to external air containing sulphuric oxide for time periods of one hour, one day, and three days, and then stored for 23 days using a conventional reinforced packaging bag package.
Figure 5:
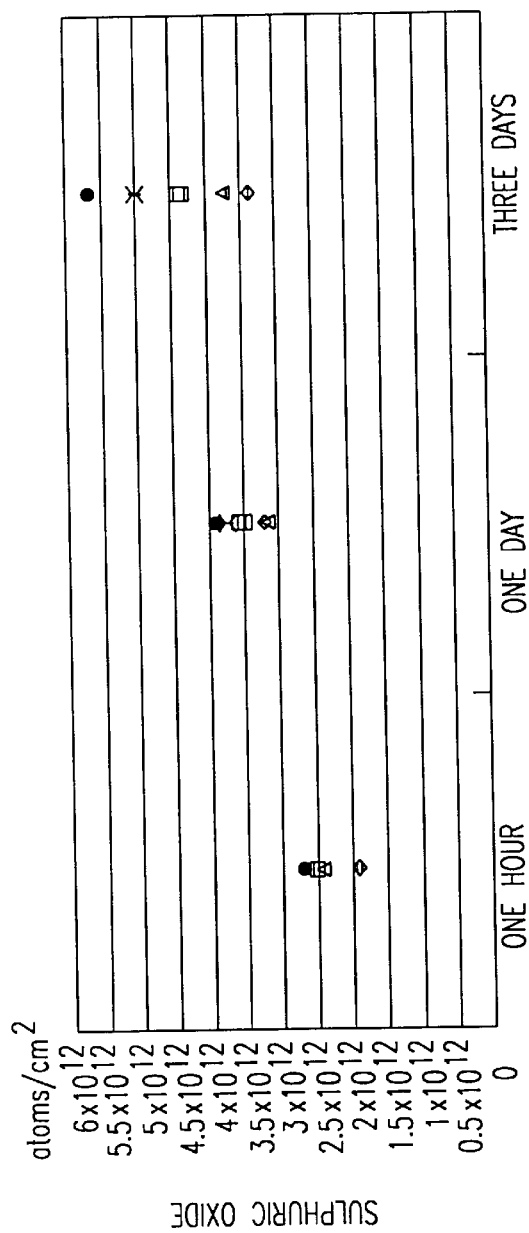
FIG. 5 is a graph depicting the amount of sulphuric oxide contamination on a wafer that was exposed to external air containing sulphuric oxide for time periods of one hour, one day, and three days, and then stored for 45 days using a conventional nitrogen flushing package.
Figure 6:
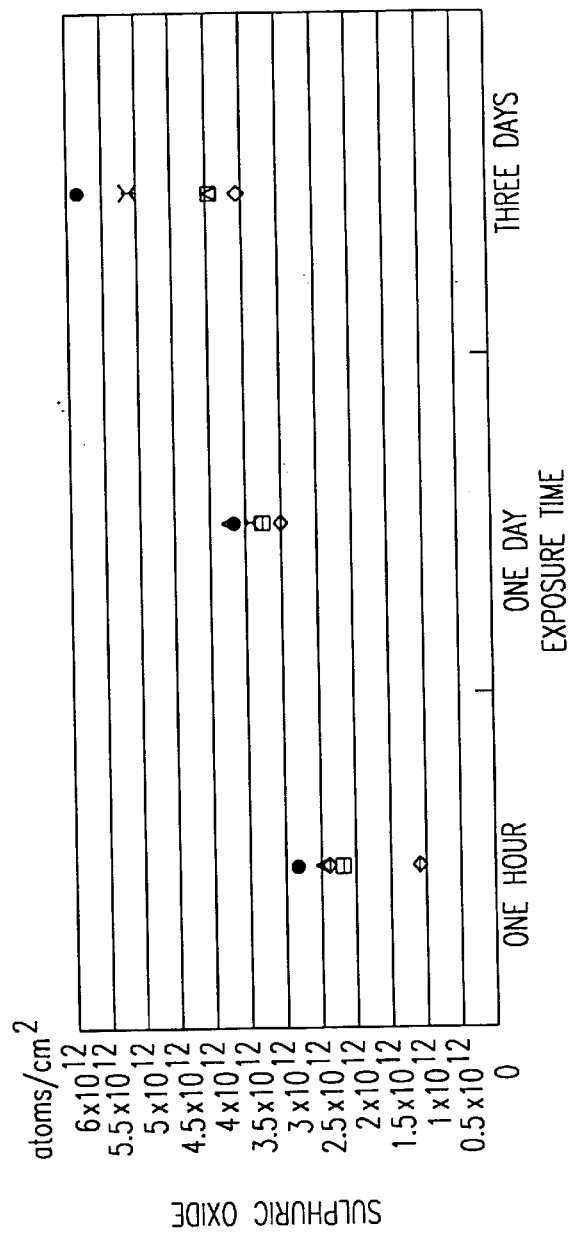
FIG. 6 is a graph depicting the amount of sulphuric oxide contamination on a wafer that was exposed to external air containing sulphuric oxide for time periods of one hour, one day, and three days, and then stored for 45 days using a conventional vacuum reduced pressure package.
Figure 7:
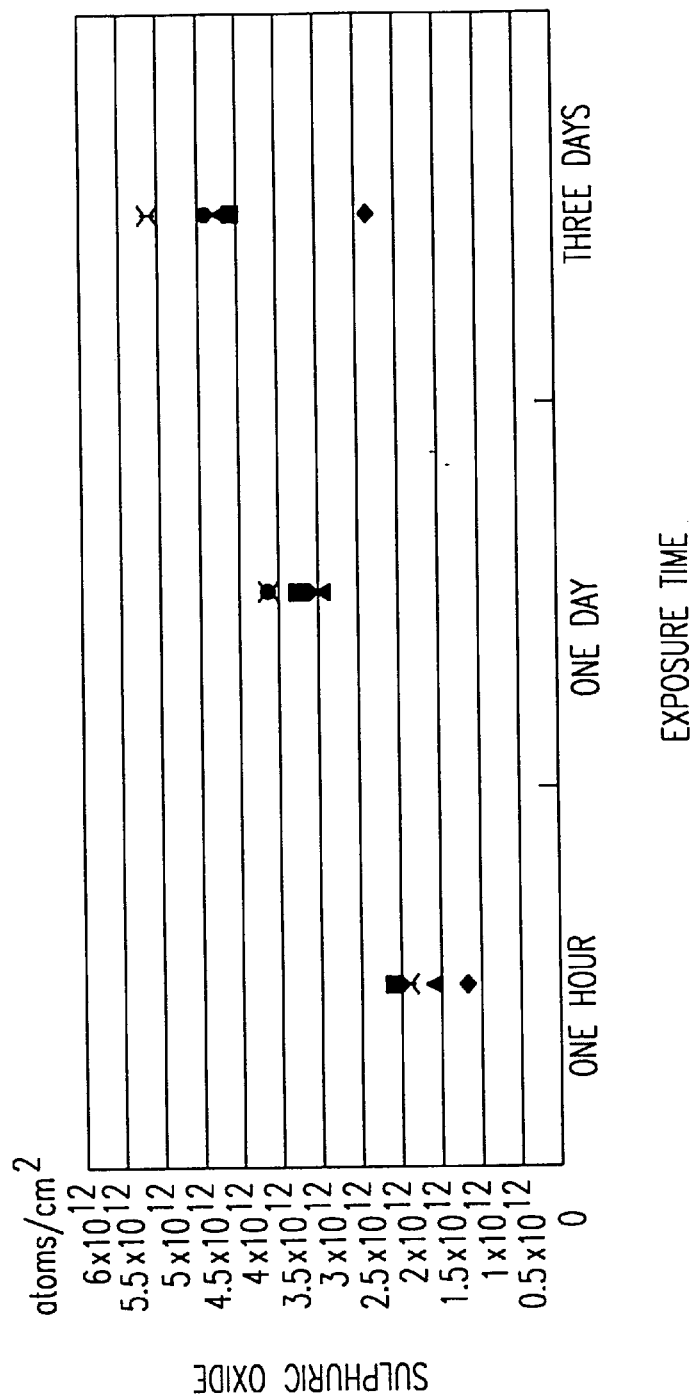
FIG. 7 is a graph depicting the amount of sulphuric oxide contamination on a wafer that was exposed to external air containing sulphuric oxide for time periods of one hour, one day, and three days, and then stored for 45 days using a conventional reinforced packaging bag package.
Figure 8:
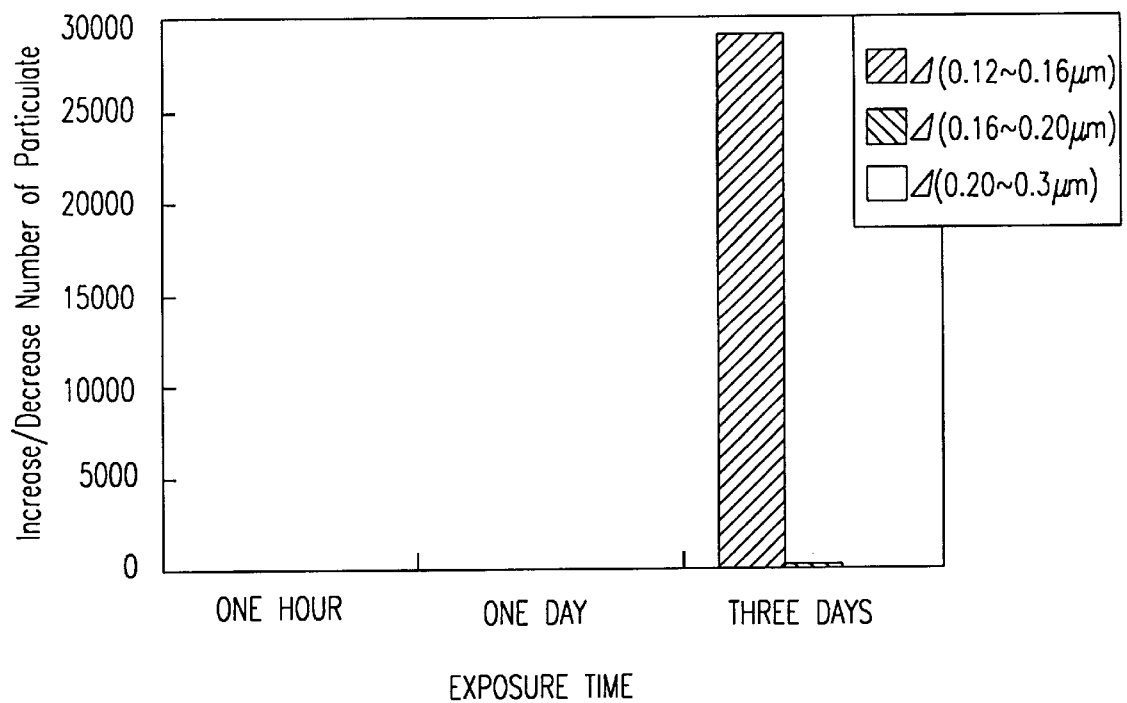
FIG. 8 is a graph depicting the particle size distribution of contaminating particles on a wafer under the conditions of FIG. 2.
Figure 9:
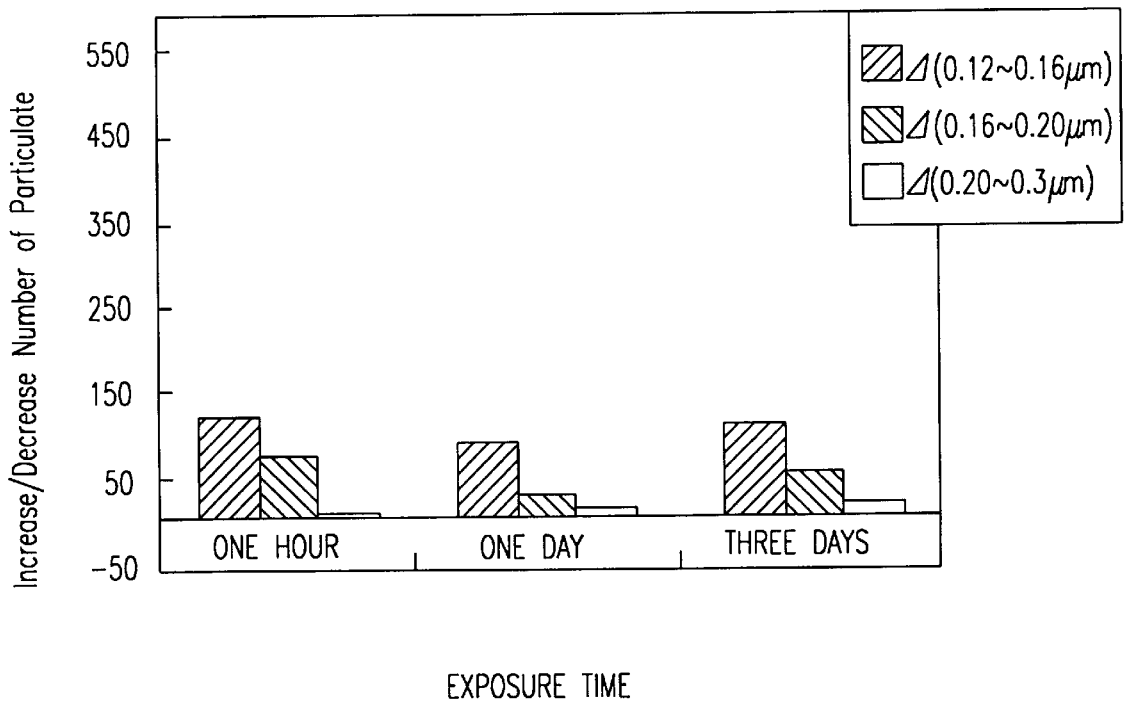
FIG. 9 is a graph depicting the particle size distribution of contaminating particles on a wafer under the conditions of FIG. 3.
Figure 10:
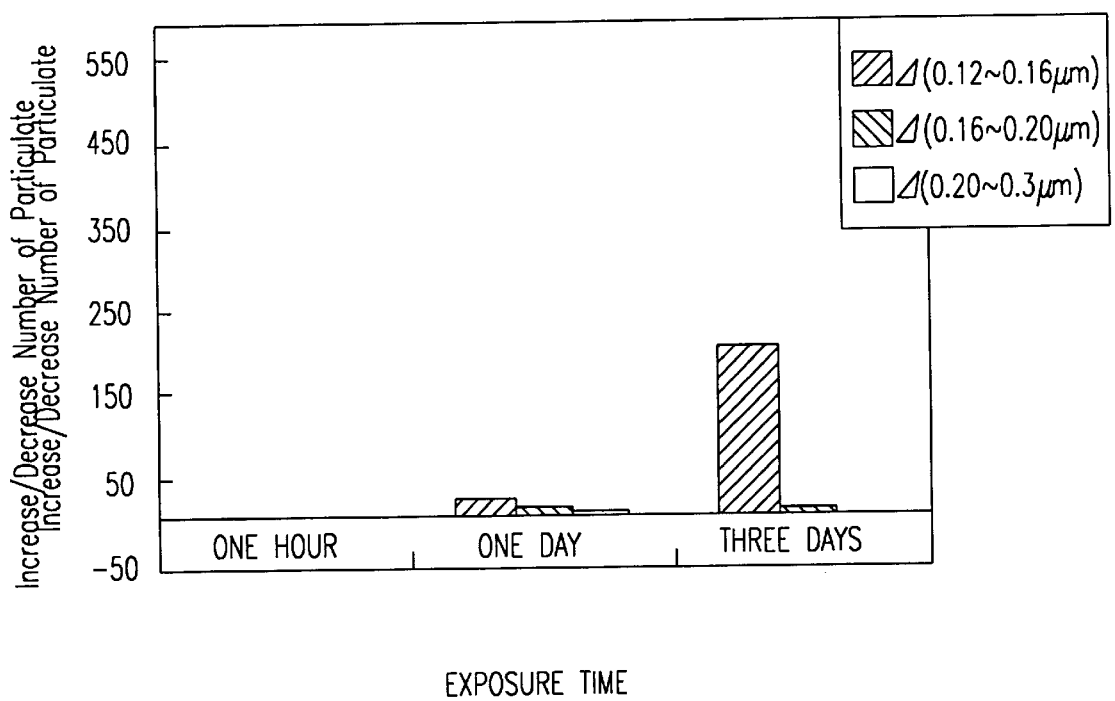
FIG. 10 is a graph depicting the particle size distribution of contaminating particles on a wafer under the conditions of FIG. 4.
Figure 11:
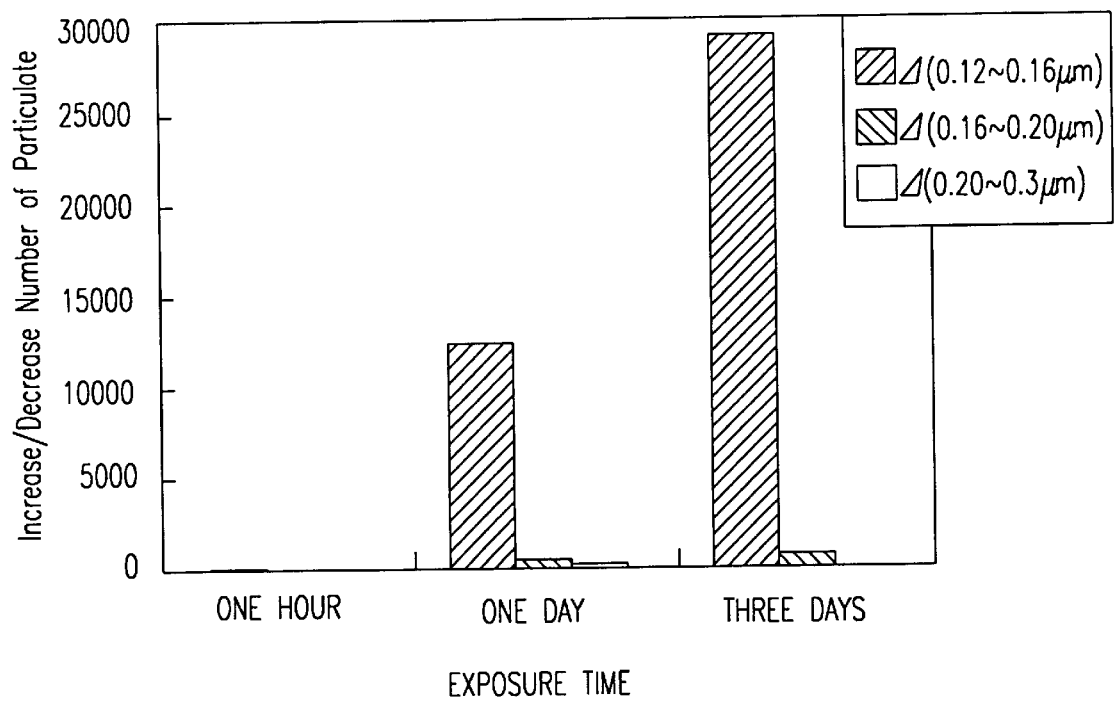
FIG. 11 is a graph depicting the particle size distribution of contaminating particles on a wafer under the conditions of FIG. 5.
Figure 12:
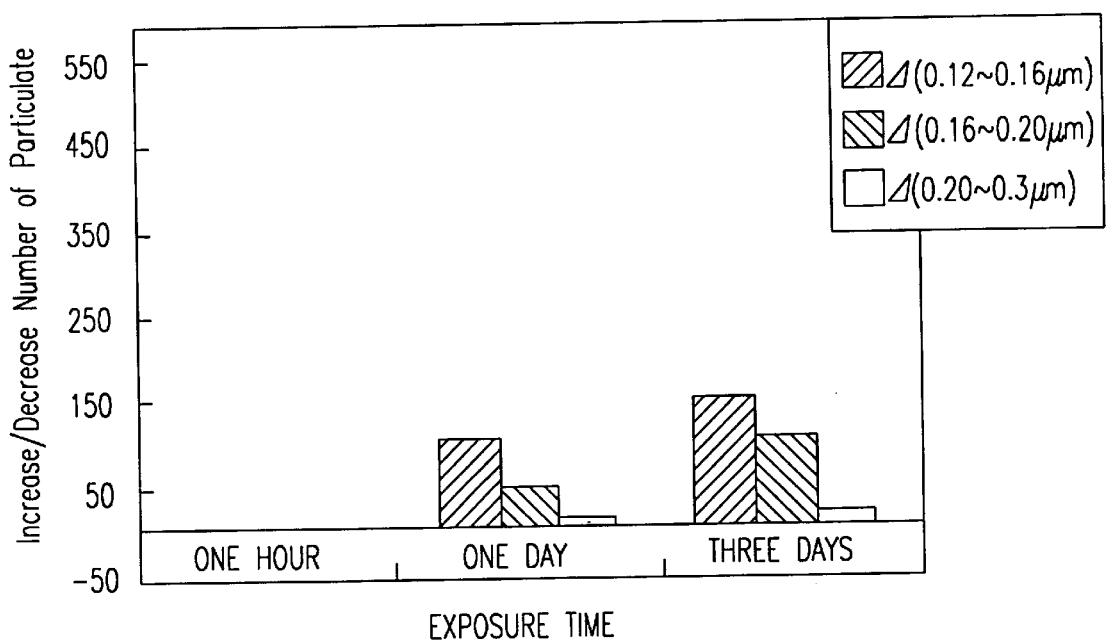
FIG. 12 is a graph depicting the particle size distribution of contaminating particles on a wafer under the conditions of FIG. 6.
Figure 13:
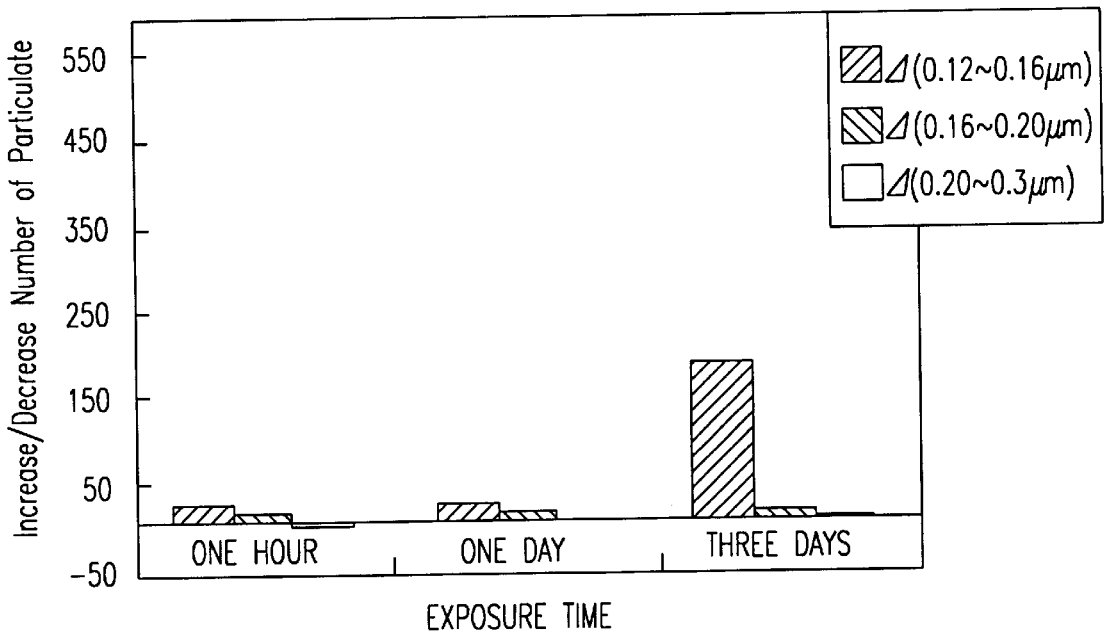
FIG. 13 is a graph depicting the particle size distribution of contaminating particles on a wafer under the conditions of FIG. 7.
Figure 14:
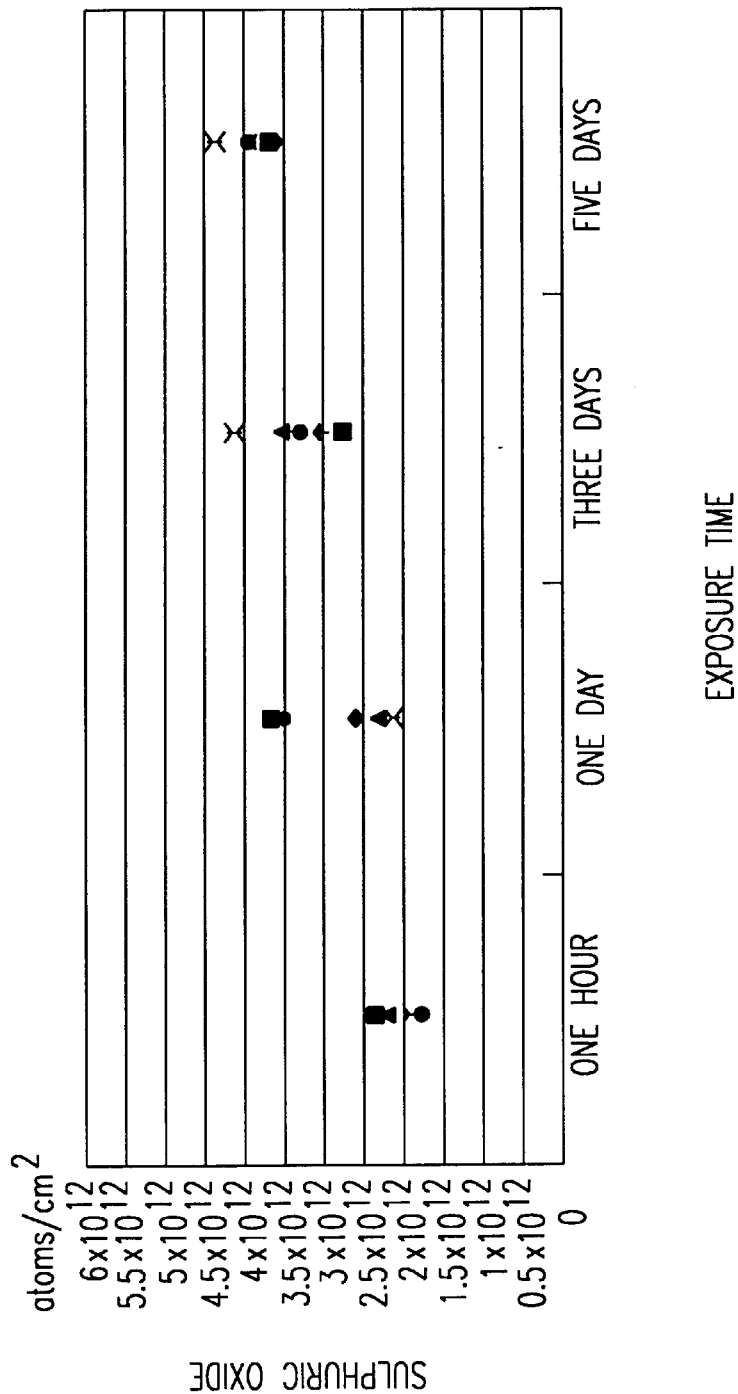
FIG. 14 is a graph depicting various amounts of sulphuric oxide contamination on a wafer exposed to the external air containing sulphuric oxide for time periods of one hour, one day, three days and five days.

In order to provide a wafer control group for analysis, the wafer was exposed for one hour, one day, three days, and five days in a Class 10 clean room, after which the amount of sulphuric oxide particles adhered to the wafer surface was measured at those time intervals. The results are shown in the graph of FIG. 14.

Embodiment 1

Figure 15:
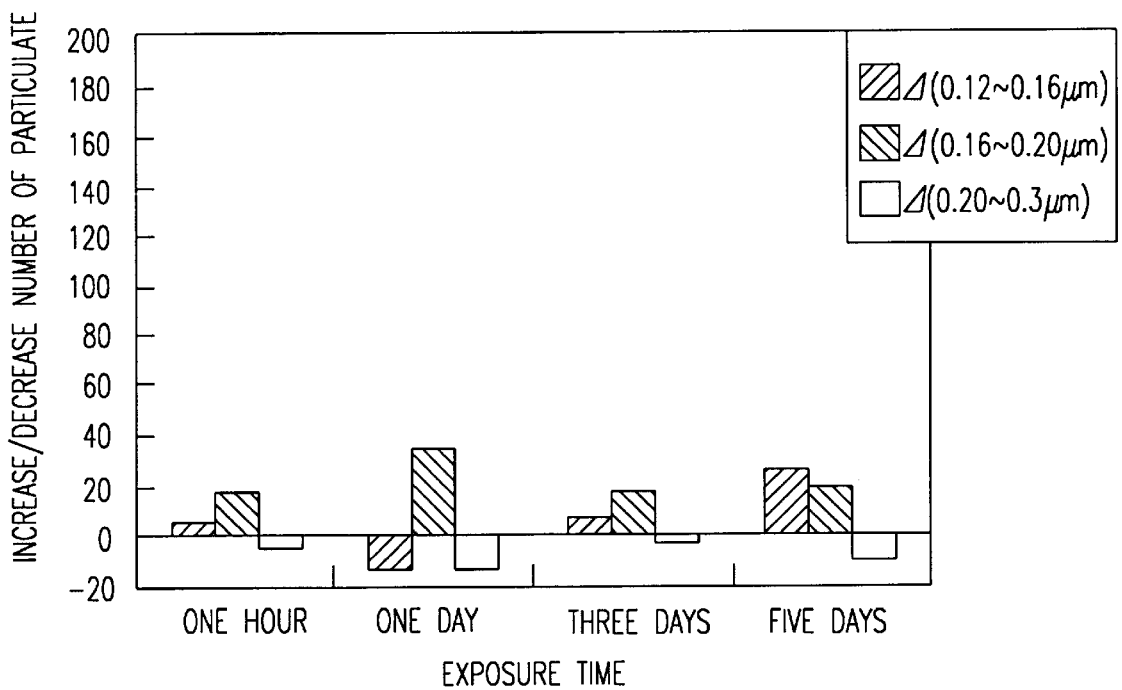
FIG. 15 is a graph depicting the increase/decrease in the number of contaminating particles, classified by particle size, on a wafer exposed to the external air under the conditions of FIG. 14 and then stored for 23 days, using a packaging method of the present invention.
Figure 16:
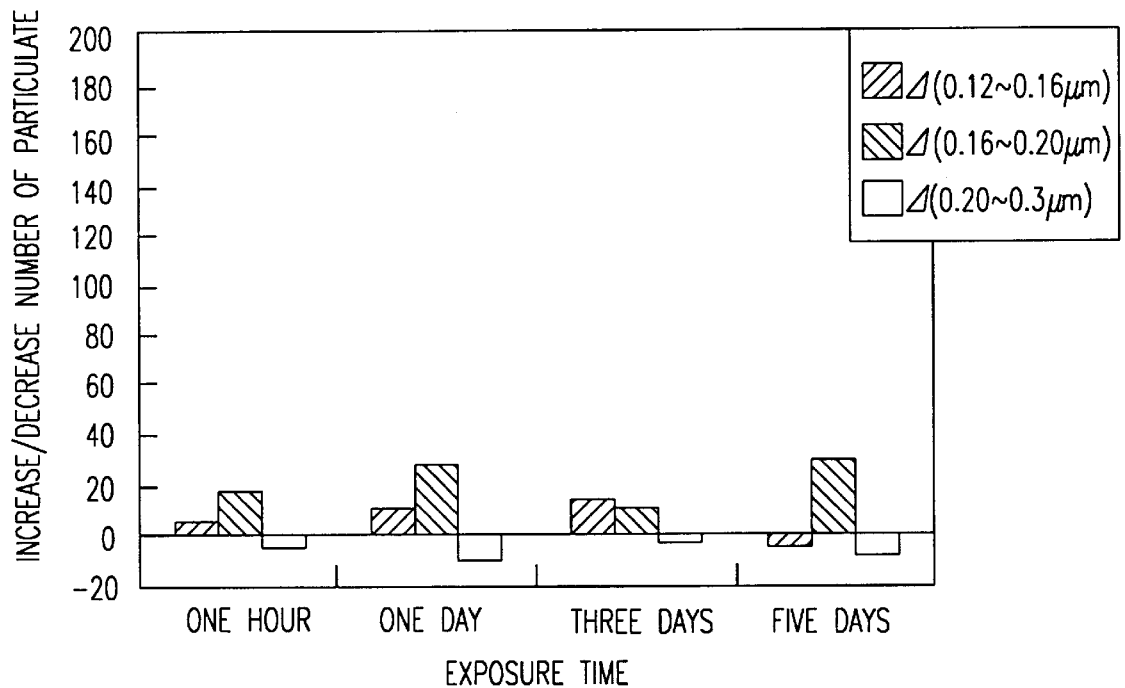
FIG. 16 is a graph depicting the increase/decrease in the number of contaminating particles, classified by particle size, on a wafer exposed to the external air under the conditions of FIG. 14 and then stored for 45 days, using a packaging method of the present invention.

In accordance with a method of the present invention, the wafers from the control group were placed in a packaging bag formed by lamination of a polyethylene film, an adhesive film, and an aluminum-coated polyethylene film. Then, the packaging bag was sealed without recourse to the conventional nitrogen flushing or longer vacuum reduced pressure packaging methods, and the wafers were stored for 23 days or 45 days. The wafers were then removed from the packaging bag and the particulate contamination was measured. FIG. 15 depicts the increase or decrease in particulate contamination after 23 days and FIG. 16 depicts the increase or decrease in particulate contamination after 45 days.

Embodiment 2

Figure 17:
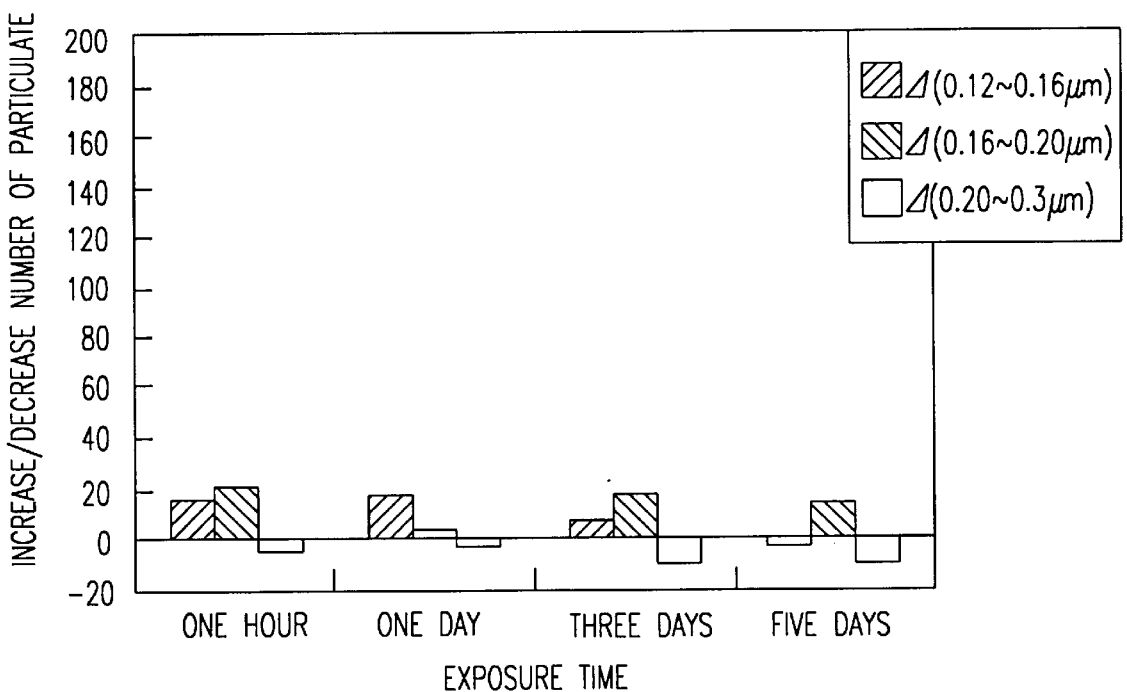
FIG. 17 is a graph depicting the increase/decrease in the number of contaminating particles, classified by particle size, on a wafer exposed to the external air under the conditions of FIG. 14 and then stored for 23 days, using another packaging method of the present invention.
Figure 18:
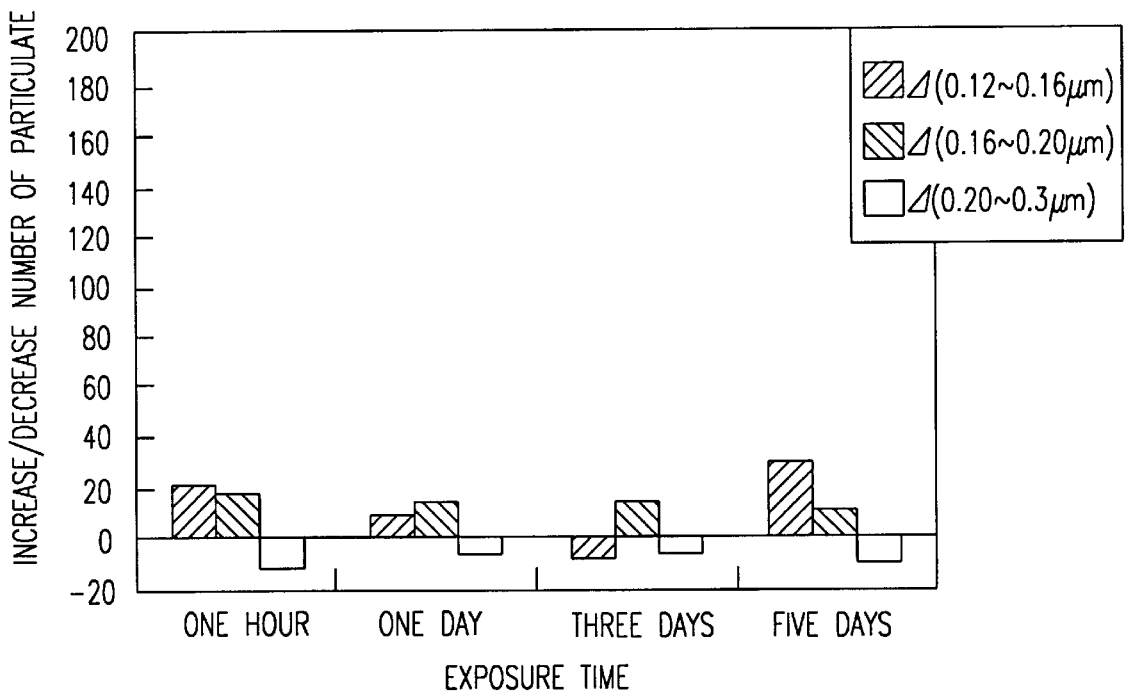
FIG. 18 is a graph depicting the increase/decrease in the number of contaminating particles, classified by particle size, on a wafer exposed to the external air under the conditions of FIG. 14 and then stored for 45 days, using another packaging method of the present invention.

In accordance with another method of the present invention, the wafers from the control group were placed in a reinforced packaging bag formed by lamination of a polyethylene film, an adhesive film, an aluminum-coated polyethylene film, another polyethylene film, and another aluminum-coated polyethylene film. Then, the packaging bag was sealed using a shorter vacuum reduced pressure packaging method, where the vacuum reduction was carried out for less than three seconds. After storing the wafers for 23 days or 45 days, they were removed from the reinforced packaging bag and the particulate contamination was measured. FIG. 17 depicts the increase or decrease in particulate contamination after 23 days and FIG. 18 depicts the increase or decrease in particulate contamination after 45 days.

Comparison Example

Figure 19:
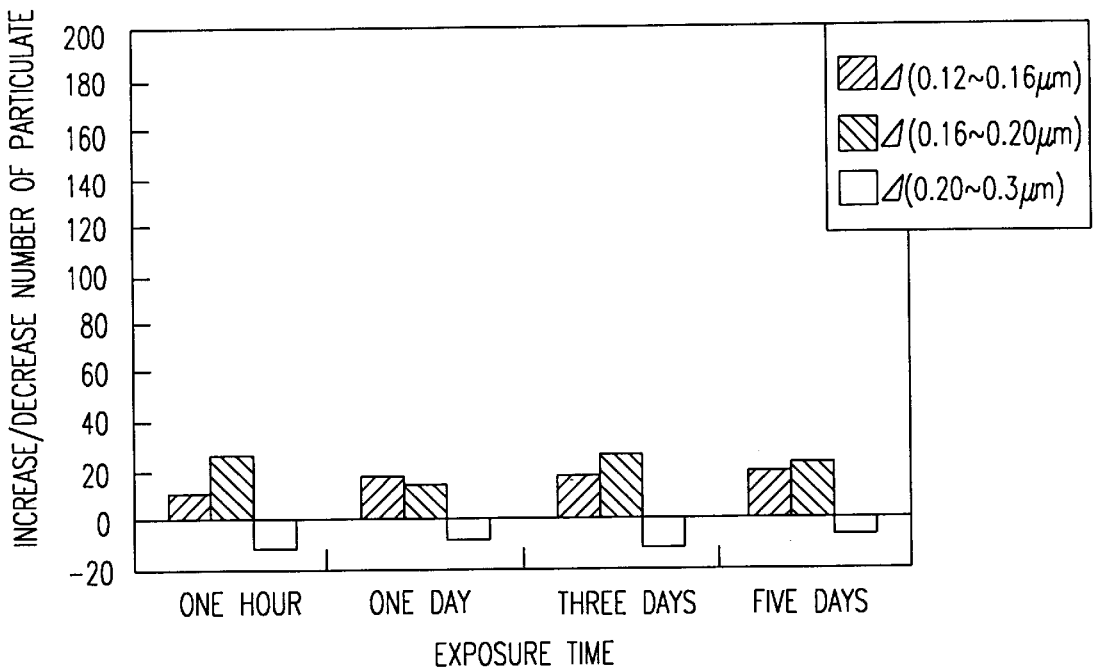
FIG. 19 is a graph depicting the increase/decrease in the number of contaminating particles, classified by particle size, on a wafer exposed to the external air under the conditions of FIG. 14 and then stored for 23 days, using the longer vacuum reduced pressure packaging of the conventional art.
Figure 20:
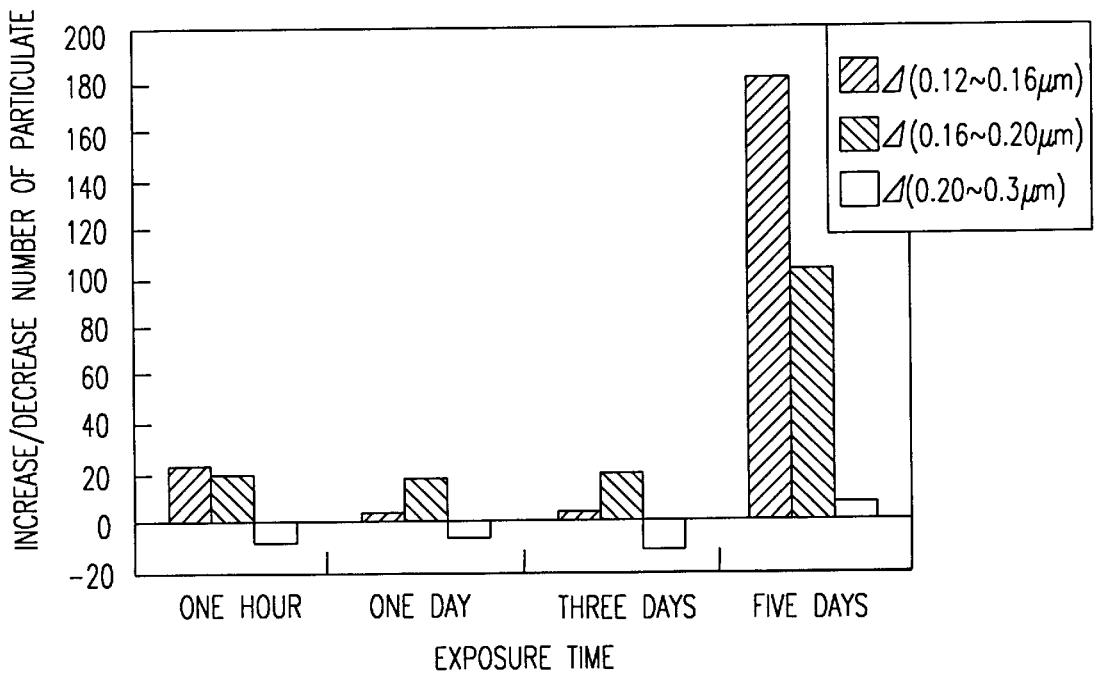
FIG. 20 is a graph depicting the increase/decrease in the number of contaminating particles, classified by particle size, on a wafer exposed to the external air under the conditions of FIG. 14 and then stored for 45 days, using the longer vacuum reduced pressure packaging of the conventional art.

The wafers from the control group were placed in a packaging bag formed by lamination of a polyethylene film, an adhesive film, and an aluminum-coated polyethylene film. Then, the packaging bag was sealed using the conventional longer vacuum reduced pressure packaging method, where the vacuum reduction was carried out for more than 4.5 seconds. After storing the wafers for 23 days or 45 days, they were removed from the packaging bag and the particulate contamination was measured. FIG. 19 depicts the increase or decrease in particulate contamination after 23 days and FIG. 20 depicts the increase or decrease in particulate contamination after 45 days.

As shown in the control group of wafers in FIG. 14, the contamination concentration of sulphuric oxide on wafer does not increase relatively significantly with respect to elapsed exposure time. For example, the increase in the sulphuric oxide contamination concentration between three and five days is very small. This indicates that any resulting increase in particulate contamination is greatly affected by the method of wafer packaging.

For the wafer packaging method of the present invention, as described in Embodiment 1 and shown in FIGS. 15 and 16, the number of particulates is kept low and does not change significantly over time, indicating a packaging method that is very favorable for wafer storage stability.

For the other wafer packaging method of the present invention, as described in Embodiment 2 and shown in FIGS. 17 and 18, the number of particulates is also kept low and does not change significantly over time, indicating a packaging method that is also very favorable for wafer storage stability.

However, as shown in the conventional packaging method, as described in the Comparison Example and shown in FIGS. 19 and 20, the particulate contamination increases greatly after five days of exposure and 45 days of storage (FIG. 20).

The number of particulates in the size range 0.12–0.16 μm was compared with the sulphuric oxide concentration according to the longer vacuum reduced packaging method of the conventional art (i.e., vacuum reduction performed for greater than 4.5 seconds), the nitrogen flushing package of the conventional art; the packaging method of the present invention, and the reinforced packaging/vacuum reduction method of the present invention (i.e., vacuum reduction performed for less than 3 seconds). The results are shown in FIG. 21, after being stored for 23 days in the packaging, and in FIG. 22, after being stored for 45 days in the packaging.

As can be seen from FIGS. 21 and 22, the packaging methods of the present invention are superior to the conventional packaging methods, and in particular, it is preferable that the wafer's initial sulphuric oxide concentration should not exceed $3\times10^{12}$ atoms/cm$^2$ before the wafer is placed in the packaging, especially if a wafer is to be stored for over 45 days. This means that the packaging must be performed in at least a Class 10 clean room. In addition, by avoiding the conventional nitrogen flushing or longer duration vacuum reduced pressure packaging methods, more favorable results are achieved. The present invention thus provides a simple and highly stable wafer packaging and storage method.

It will be apparent that the foregoing description of the invention has been presented for purposes of illustration and description and for providing an understanding of the invention and that many changes and modifications can be made without departing from the scope of the invention. It is therefore intended that the scope of the invention be indicated by the appended claims and their equivalents.

What is claimed is:

1. A wafer packaging method, comprising:

monitoring a concentration of sulphuric oxide on a surface of a wafer;

preparing a wafer packaging bag for accepting the wafer;

before the concentration of sulphuric oxide on the surface attains a level of $3\times10^{12}$ atoms/cm$^2$, placing the wafer in the wafer packaging bag in a substantially clean environment; and sealing the wafer packaging bag, wherein the preparing and placing are performed in at least a Class 10 clean room with a reduced content of sulphuric oxide, and wherein the preparing and placing are performed without subjecting the wafer packaging bag to a nitrogen flushing sequence.

2. The wafer packaging method as claimed in claim 1, wherein during the preparing, the wafer packaging bag is one formed by lamination of a polyethylene film, an adhesive film, and an aluminum-coated polyethylene film.

3. A wafer packaging method, comprising:

monitoring a concentration of sulphuric oxide on a surface of a wafer;

preparing a wafer packaging bag, comprising a laminate of films and a reinforcement layered on said laminate, for accepting the wafer;

before the concentration of sulphuric oxide on the surface attains a level of $3\times10^{12}$ atoms/cm$^2$, placing the wafer in the wafer packaging bag in a substantially clean environment, and sealing the wafer packaging bag without subjecting the wafer packaging bag to any nitrogen flushing sequence and reducing the pressure within the wafer packaging bag for a time period of less than 3 seconds.

4. The wafer packaging method as claimed in claim 3, wherein the preparing and placing are performed in a clean room of at least Class 10.

* * * * *